US007915521B2

(12) United States Patent
Forrest et al.

(10) Patent No.: US 7,915,521 B2
(45) Date of Patent: Mar. 29, 2011

(54) TYPE II QUANTUM DOT SOLAR CELLS

(75) Inventors: Stephen R. Forrest, Ann Arbor, MI (US); Guodan Wei, Ann Arbor, MI (US); Kuen-Ting Shiu, Ann Arbor, MI (US)

(73) Assignees: The Trustees of Princeton University, Princeton, NJ (US); The Regents of the University of Michigan, Ann Arbor, MI (US)

( * ) Notice: Subject to any disclaimer, the term of this patent is extended or adjusted under 35 U.S.C. 154(b) by 354 days.

(21) Appl. No.: 11/869,954

(22) Filed: Oct. 10, 2007

(65) Prior Publication Data

US 2009/0095349 A1  Apr. 16, 2009

(51) Int. Cl.
*H01L 31/042* (2006.01)
*H01L 31/00* (2006.01)
*H01L 21/00* (2006.01)

(52) U.S. Cl. .......... 136/255; 136/262; 438/57; 977/932; 977/948

(58) Field of Classification Search .................. 136/262, 136/255; 438/57; 977/932, 948
See application file for complete search history.

(56) References Cited

U.S. PATENT DOCUMENTS

| 6,239,449 | B1 | 5/2001 | Fafard et al. | |
|---|---|---|---|---|
| 6,583,436 | B2 | 6/2003 | Petroff et al. | |
| 2002/0050288 | A1* | 5/2002 | Suzuki | 136/255 |
| 2002/0094597 | A1 | 7/2002 | Lin et al. | |
| 2007/0151592 | A1* | 7/2007 | Forrest et al. | 136/243 |

FOREIGN PATENT DOCUMENTS

| EP | 1 729 347 A2 | 6/2006 |
|---|---|---|
| JP | 2006-114815 | 4/2006 |

OTHER PUBLICATIONS

Laghumavarapu et al. "GaSb/GaAs type II quantum dot solar cells for enhanced infrared spectral response" App. Phy. Let. v. 90, p. 173125, 2007.*
Hwang et al. "Photovoltaic In0.5Ga0.5As/GaAs quantum dot infrared photodetector with a single-sided Al0.3Ga0.7As layer" Microelectronic Engineering, v. 78-79, Mar. 2005, p. 229-232.*
Anderson et. al. Open-circuit voltage characteristics of InP-based quantum well solar cells. J. Appl. Phys. 79 (4), 1996, pp. 1973-1978.
Aroutiounian et. al. Studies of the photocurrent in quantum dot solar cells by the application of a new theoretical model. Solar Energy Materials & Solar Cells 89 (2005), pp. 165-173.
Asryan et. al. Inhomogeneous line broadening and the threshold current density of a semiconductor quantum dot laser. Semicond. Sci. Technol. 11 (1996), pp. 554-567.

(Continued)

*Primary Examiner* — Jeffrey T Barton
*Assistant Examiner* — Allison Bourke
(74) *Attorney, Agent, or Firm* — Finnegan, Henderson, Farabow, Garrett & Dunner, L.L.P.

(57) ABSTRACT

A device comprises a plurality of fence layers of a semiconductor material and a plurality of alternating layers of quantum dots of a second semiconductor material embedded between and in direct contact with a third semiconductor material disposed in a stack between a p-type and n-type semiconductor material. Each quantum dot of the second semiconductor material and the third semiconductor material form a heterojunction having a type II band alignment. A method for fabricating such a device is also provided.

8 Claims, 6 Drawing Sheets

OTHER PUBLICATIONS

Born et. al. Radiative Recombination in Type II GaSb/GaAs Quantum Dots. Phys. Stat. Sol. B 228, No. 3 (2001), pp. R4-R5.

Chang et. al. Photocurrent studies of the carrier escape process from InAs self assembled quantum dots. Phys. Rev. B, vol. 62 (2000), pp. 6259-6962.

Ebiko et. al. "Island Size Scaling in InAs/GaAs Self-Assembled Quantum Dots," Physical Review Letters 80, pp. 2650-2653 (1998).

Geller et. al. 450 meV hole localization in GaSb/GaAs quantum dots. Appl. Phys. Lett., vol. 82 (2003) pp. 2706-2708.

Grundmann et. al. InAs/GaAs pyramidal quantum dots: Strain distribution, optical phonons, and electronic structure. Phys. Rev. B, vol. 52, (1995), pp. 11969-11981.

Hatami et. al. Radiative recombination in type-II GaSb/GaAs quantum dots. Appl. Phys. Lett. 67 (1995), pp. 656-658.

Hatami et. al. Carrier dynamics in type-II GaSb/GaAs quantum dots. Phys. Rev. B, vol. 57, No. 8 (1998), pp. 4635-4641.

Kapetyn et. al. Electron escape from InAs quantum dots. Phys. Rev. B, vol. 60, No. 20 (1999), pp. 14265-14268.

Kirsch et. al. Many-particle effects in type II quantum dots. Appl. Phys. Lett. vol. 78, No. 10 (2001), pp. 1418-1420.

Luque et. al. Increasing the Efficiency of Ideal Solar Cells by Photon Induced Transitions at Intermediate Levels. Phys. Rev. Lett. vol. 78, No. 26 (1997), pp. 5014-5017.

Luque, et al. "Progress toward the practical implementation of the intermediate band solar cell." Conference Record of the Twenty-Ninth IEEE Photovoltaic Specialists Conference, pp. 1190-1193 (2002).

Marti et al. "Partial Filling of a Quantum Dot Intermediate Band for Solar Cells." IEEE Transaction on Electron Devices, 48, pp. 2394-2399 (2001).

Marti et al. "Design constraints of quantum-dot intermediate band solar cell." Physical E 14, pp. 150-157 (2002).

Marti et. al. Novel semiconductor solar cell structures: The quantum fot intermediate band solar cell. Thin Solid Films 511-512 (2006), pp. 638-644.

Sionnest. Quantum Dots a new quantum state? Nature Mater. vol. 4 (2005), pp. 653- 654.

Schaller et. al. High Efficiency Carrier Multiplication in PbSe Nanocrystals:. Implications for Solar Energy Conversion. Phys. Rev. Lett., vol. 92, No. 18 (2004) pp. 186601-1 to 186601-4.

Tatebayashi et. al., Formation and optical characteristics of strain-relieved and densely stacked GaSb/GaAs quantum dots. Appl. Phys. Lett. 89 (2006), pp. 203116-1 to 203116-3.

Wetzler et. al. Capacitance-voltage characteristics of InAs/GaAs quantum dots embedded in a pn structure. Appl. Phys. Lett., vol. 77, No. 11 (2000), pp. 1671-1673.

International Search Report and Written Opinion, dated Mar. 1, 2010, issued in PCT/US2008/079412.

Cuadra, L. et al.; "Present status of itnermeidate band solar cell research"; Thin Sold Films, vol. 451-452, Mar. 22, 2004, pp. 593-599.

Cuadra, L. et al.; "Type II broken band heterostructure quantum dot to obtain a material for the intermediate band solar cell"; Physica E.: Low-Dimensional Systems and Nonstructures; vol. 14, No. 1,2; Apr. 2002; pp. 162-165.

Laghumawarapu R. et all.; "GaSb/GaAs type II quantum dot solar cells for enhanced infrared spectral response"; Applied Physics Letters, AIP, American Institute of Physics, Melville, NY, vol. 90, No. 17, Apr. 27, 2007, pp. 173125-1 to 173125-3.

Somsak Panyakeow Ed—Yen-Liang Yeh et al.;—"High Efficiency Quantum Dot Molecule Solar Cells for High Concentration Sunlight Application"; Jan. 1, 2007; Nano Micro Engineered and molecular Systems, 2007; Nems '07. $2^{nd}$ IEEE International Conference on IEEE, Piscataway, NJ; pp. 1145-1148.

Wei, G., et al.; "Intermediate-Band Solar Cells Employing Quantum Dots Embedded in an Energy Fence Barrier"; Nano Letters, ACS, Washington, DC, vol. 7, No. 1, Dec. 2, 2006, pp. 218-222.

* cited by examiner

TYPE II QUANTUM DOT SOLAR CELLS

JOINT RESEARCH AGREEMENT

Portions of the claimed invention were made by, on behalf of, and/or in connection with one or more of the following parties to a joint university-corporation research agreement Princeton University, The University of Southern California, and Global Photonic Energy Corporation. The remainder of the claimed invention was made by, on behalf of, and/or in connection with one or more of the following parties to a joint university-corporation research agreement The University of Michigan, The University of Southern California, and Global Photonic Energy Corporation. The agreements were in effect on and before the date the respective portions of the claimed invention were made, and the claimed invention was made as a result of activities undertaken within the scope of the agreements.

FIELD OF THE INVENTION

The present invention generally relates to photosensitive optoelectronic devices. More specifically, it is directed to photosensitive optoelectronic devices with quantum dots in an inorganic semiconductor matrix, where the quantum dots and semiconductor matrix material form a heterojunction having a type II band alignment.

BACKGROUND

Optoelectronic devices rely on the optical and electronic properties of materials to either produce or detect electromagnetic radiation electronically or to generate electricity from ambient electromagnetic radiation.

Photosensitive optoelectronic devices convert electromagnetic radiation into an electrical signal or electricity. Solar cells, also called photovoltaic ("PV") devices, are a type of photosensitive optoelectronic device that is specifically used to generate electrical power. Photoconductor cells are a type of photosensitive optoelectronic device that are used in conjunction with signal detection circuitry which monitors the resistance of the device to detect changes due to absorbed light. Photodetectors, which may receive an applied bias voltage, are a type of photosensitive optoelectronic device that are used in conjunction with current detecting circuits which measures the current generated when the photodetector is exposed to electromagnetic radiation.

These three classes of photosensitive optoelectronic devices may be distinguished according to whether a rectifying junction as defined below is present and also according to whether the device is operated with an external applied voltage, also known as a bias or bias voltage. A photoconductor cell does not have a rectifying junction and is normally operated with a bias. A PV device has at least one rectifying junction and is operated with no bias. A photodetector has at least one rectifying junction and is usually but not always operated with a bias.

As used herein, the term "rectifying" denotes, inter alia, that an interface has an asymmetric conduction characteristic, i.e., the interface supports electronic charge transport preferably in one direction. The term "photoconductive" generally relates to the process in which electromagnetic radiant energy is absorbed and thereby converted to excitation energy of electric charge carriers so that the carriers can conduct (i.e., transport) electric charge in a material. The term "photoconductive material" refers to semiconductor materials which are utilized for their property of absorbing electromagnetic radiation to generate electric charge carriers. When electromagnetic radiation of an appropriate energy is incident upon a photoconductive material, a photon can be absorbed to produce an excited state. There may be intervening layers, unless it is specified that the first layer is "in physical contact with" or "in direct contact with" the second layer.

In the case of photosensitive devices, the rectifying junction is referred to as a photovoltaic heterojunction. To produce internally generated electric fields at the photovoltaic heterojunction which occupy a substantial volume, the usual method is to juxtapose two layers of material with appropriately selected semi-conductive properties, especially with respect to their Fermi levels and energy band edges.

Types of inorganic photovoltaic heterojunctions include a p-n heterojunction formed at an interface of a p-type doped material and an n-type doped material, and a Schottky-barrier heterojunction formed at the interface of an inorganic photoconductive material and a metal.

In inorganic photovoltaic heterojunctions, the materials forming the heterojunction have been denoted as generally being of either n-type or p-type. Here n-type denotes that the majority carrier type is the electron. This could be viewed as a material having many electrons in relatively free energy states. The p-type denotes that the majority carrier type is the hole. Such a material has many holes in relatively free energy states.

One common feature of semiconductors and insulators is a "bandgap." The bandgap is the energy difference between the highest energy level filled with electrons and the lowest energy level that is empty. In an inorganic semiconductor or inorganic insulator, this energy difference is the difference between the valence band edge $E_V$ (top of the valence band) and the conduction band edge $E_C$ (bottom of the conduction band). The bandgap of a pure material is devoid of energy states where electrons and holes can exist. The only available carriers for conduction are the electrons and holes which have enough energy to be excited across the bandgap. In general, semiconductors have a relatively small bandgap in comparison to insulators.

In terms of an energy band model, excitation of a valence band electron into the conduction band creates carriers; that is, electrons are charge carriers when on the conduction-band-side of the bandgap, and holes are charge carriers when on the valence-band-side of the bandgap.

As used herein, a first energy level is "above," "greater than," or "higher than" a second energy level relative to the positions of the levels on an energy band diagram under equilibrium conditions. Energy band diagrams are a workhorse of semiconductor models. As is the convention with inorganic materials, the energy alignment of adjacent doped materials is adjusted to align the Fermi levels ($E_F$) of the respective materials, bending the vacuum level between doped-doped interfaces and doped-intrinsic interfaces.

As is the convention with energy band diagrams, it is energetically favorable for electrons to move to a lower energy level, whereas it is energetically favorable for holes to move to a higher energy level (which is a lower potential energy for a hole, but is higher relative to an energy band diagram). Put more succinctly, electrons fall down whereas holes fall up.

In inorganic semiconductors, there may be a continuum of conduction bands above the conduction band edge ($E_C$) and a continuum of valence bands below the valence band edge ($E_V$).

Carrier mobility is a significant property in inorganic and organic semiconductors. Mobility measures the ease with which a charge carrier can move through a conducting material in response to an electric field. In comparison to semiconductors, insulators generally provide poor carrier mobility.

SUMMARY OF THE INVENTION

An optoelectronic device and a method for fabricating such a device is provided, in which the device comprises a plurality of fence layers consisting essentially of a semiconductor material disposed in a stack between a p-type and n-type semiconductor material and a plurality of layers consisting essentially of alternating layers of quantum dots of a second semiconductor material embedded between and in direct contact with a third semiconductor material. The alternating layers are disposed in the stack between and in direct contact with a respective two of the fence layers. Each quantum dot provides at least one quantum state at an energy between a conduction band edge and a valence band edge of the adjacent layers of the first semiconductor material. Each quantum dot of the second semiconductor material and the third semiconductor material form a heterojunction having a type II band alignment. The third semiconductor material may be an inorganic semiconductor matrix.

In one embodiment, the first semiconductor material is $Al_xGa_{1-x}As$, wherein x>0, the second semiconductor material is GaSb and the third semiconductor material is GaAs.

In another embodiment, the device includes from about 10 to about 20 alternating layers of GaAs/GaSb.

The structures in the figures are not necessarily drawn to scale.

DETAILED DESCRIPTION

One method being explored to improve the efficiency of solar cells is to use quantum dots to create an intermediate band within the bandgap of the solar cell. Quantum dots confine charge carriers (electrons, holes, and/or excitons) in three-dimensions to discrete quantum energy states. The cross-sectional dimension of each quantum dot is typically on the order of hundreds of Ångstroms or smaller.

Figure 1:
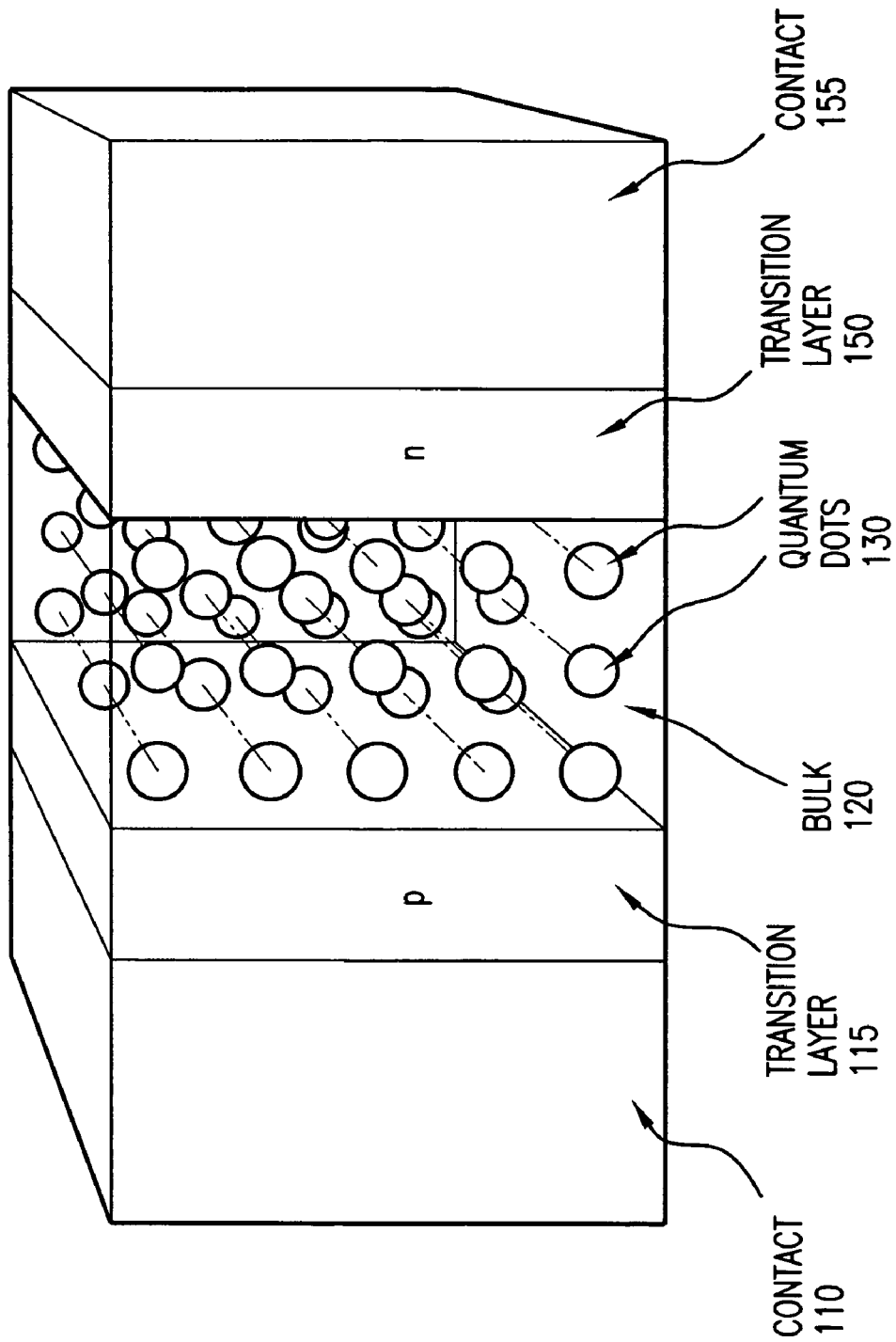
FIG. 1 illustrates a quantum dot solar cell.

FIG. 1 illustrates an example of a quantum dot solar cell device. The device comprises a first contact (electrode) 110, a first transition layer 115, a plurality of quantum dots 130 embedded in a semiconductor bulk matrix material 120, a second transition layer 150, and a second contact (electrode) 155.

In a device made of inorganic materials, one transition layer (115, 150) may be p-type, with the other transition layer being n-type. The bulk matrix material 120 and the quantum dots 130 may be intrinsic (not doped). The interfaces between the transition layers 115, 150 and the bulk matrix material 120 may provide rectification, polarizing current flow within the device. As an alternative, current-flow rectification may be provided by the interfaces between the contacts (110, 155) and the transition layers (115, 150).

Figure 5:
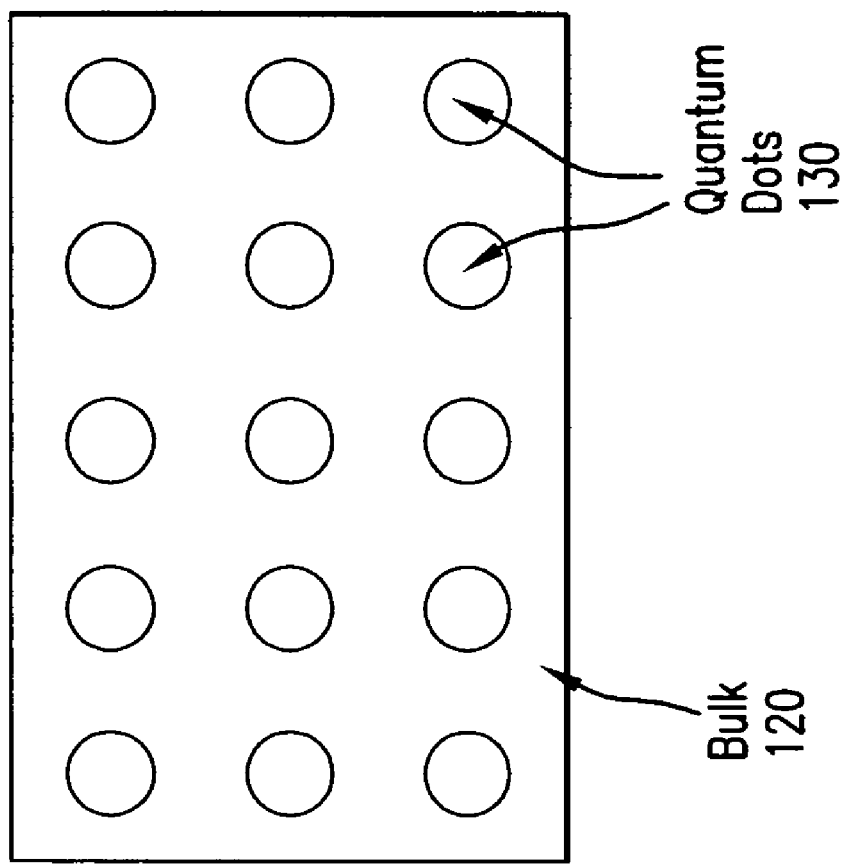
FIG. 5 shows a cross-section of the array of quantum dots in the device in FIG. 1, as generally idealized and as formed in colloidal solutions.

FIG. 5 illustrates a cross-section of the device including an array of spherical quantum dots. In practice, the actual shape of the dots depends upon the choice of fabrication techniques. For example, inorganic quantum dots can be formed as semiconductor nanocrystallites in a colloidal solution, such as the "sol-gel" process known in the art. With some other arrangements, even if the actual dots are not true spheres, spheres may nonetheless provide an accurate model.

For example, an epitaxial method that has been successful in the creation of inorganic quantum dots in an inorganic matrix is the Stranski-Krastanow method (sometimes spelled Stransky-Krastanow in the literature). This method efficiently creates a lattice-mismatch strain between the dots and the bulk matrix while minimizing lattice damage and defects. Stranski-Krastanow is sometimes referred to as the "self-assembled quantum dot" (SAQD) technique.

The self-assembled quantum dots appear spontaneously, substantially without defects, during crystal growth with metal-organic chemical vapor deposition (MOCVD) or molecular beam epitaxy (MBE). Using growth conditions of the Stranski-Krastanow method, it is possible to create arrays and stacks of tiny dots (~10 nm), self-ordered, with both high area density (>$10^{11}$ cm$^{-2}$) and optical quality. Self-ordered quantum dot (SOQD) techniques are able to create a three-dimensional quasi-crystal made up of a high density of defect-free quantum dots where radiative recombination is dominant.

For additional background on inorganic intermediate-band quantum dot devices and fabrication, see A. Marti et al., "Design constraints of quantum-dot intermediate band solar cell," Physica E 14, 150-157 (2002); A. Luque, et al., "Progress towards the practical implementation of the intermediate band solar cell," Conference Record of the Twenty-Ninth IEEE Photovoltaic Specialists Conference, 1190-1193 (2002); A. Marti et al., "Partial Filling of a Quantum Dot Intermediate Band for Solar Cells," IEEE Transactions on Electron Devices, 48, 2394-2399 (2001); Y. Ebiko et al., "Island Size Scaling in InAs/GaAs Self-Assembled Quantum Dots," Physical Review Letters 80, 2650-2653 (1998); and U.S. Pat. No. 6,583,436 B2 to Petroff et al. (Jun. 24, 2003); each of which is incorporated herein by reference for its description of the state of the art.

Quantum dot intermediate band solar cells have been actively investigated in recent years since it has been asserted that such cells have the potential for realizing solar power conversion efficiencies >60%. See A. Luque and A. Marti, Phys. Rev. Lett. 78, 5014(1997). Indeed, low bandgap energy quantum dots can generate multiple electron-hole pairs (excitons) by absorption of a single high-energy photon, leading, in principle, to quantum efficiencies in excess of 100%. See R. D. Schaller and V. I. Klimov, Phys. Rev. Lett. 92, 186601-1(2004); and G. S. Philippe, Nature Mater. 4, 653(2005). To expand the spectral response to longer wavelengths, narrow bandgap quantum dots (e.g. InAs) need to be packed sufficiently close to form an intermediate energy band within the gap of the host matrix material (e.g. GaAs).

However, the high concentration of strained quantum dots introduces a high charge density ($\sim 1\times 10^{16}$ cm$^{-3}$—see R. Wetzler, A. Wacker, E. Schll, C. M. A. Kapteyn, R. Heitz and D. Bimberg, Appl. Phys. Lett. 77, 1671(2000)) in the dot region, and photoexcited carriers (electron and hole) are rapidly captured by the self-assembled quantum dots. Consequently, the very high efficiencies predicted for quantum dot intermediate band solar cells have not been realized, due in part to non-ideal band structures that result in charge trapping followed by recombination of the photocarriers in the dots. In contrast to laser applications where fast carrier trapping is required (see L. V. Asryan and R. A. Suris, Semicond. Sci. Technol. 11, 554 (1996)), photogenerated carriers must tunnel through, or be transported around the quantum dots to avoid trapping and recombination at these sites.

Theoretical models (see V. Aroutiounian, S. Petrosyan and A. Khachatryan, Solar Energy Mater. & Solar Cells 89, 165 (2005)) confirm that for relatively short recombination times (~2 ns), quantum dots act primarily as recombination rather than as generation centers, resulting in a decrease in photocurrent with an increase in the number (N) of quantum dot layers within the larger bandgap semiconductor host. Partial filling of confined states in the dot region of intermediate band solar cells by Si δ-doping (see A. Martí, N. López, E. Antolin, C. Stanley, C. Farmer, L. Cuadra and A. Luque, Thin Solid Films 511, 638 (2006)) of the host has shown limited success. Although these devices have photoresponse extended to longer wavelengths, they also exhibit a significantly reduced open circuit voltage ($V_{oc}$) compared to large bandgap homojunction cells.

While formation of an intermediate band improves device performance, the results have failed to approach the expected theoretical improvement in photocurrent. Power efficiencies >60% have been predicted for idealized quantum dot intermediate band solar cells. This goal has not yet been realized, due in part to non-idealities that result in charge trapping followed by recombination of photocarriers in the quantum dots, and the lack of an optimal materials combination.

Figure 6:
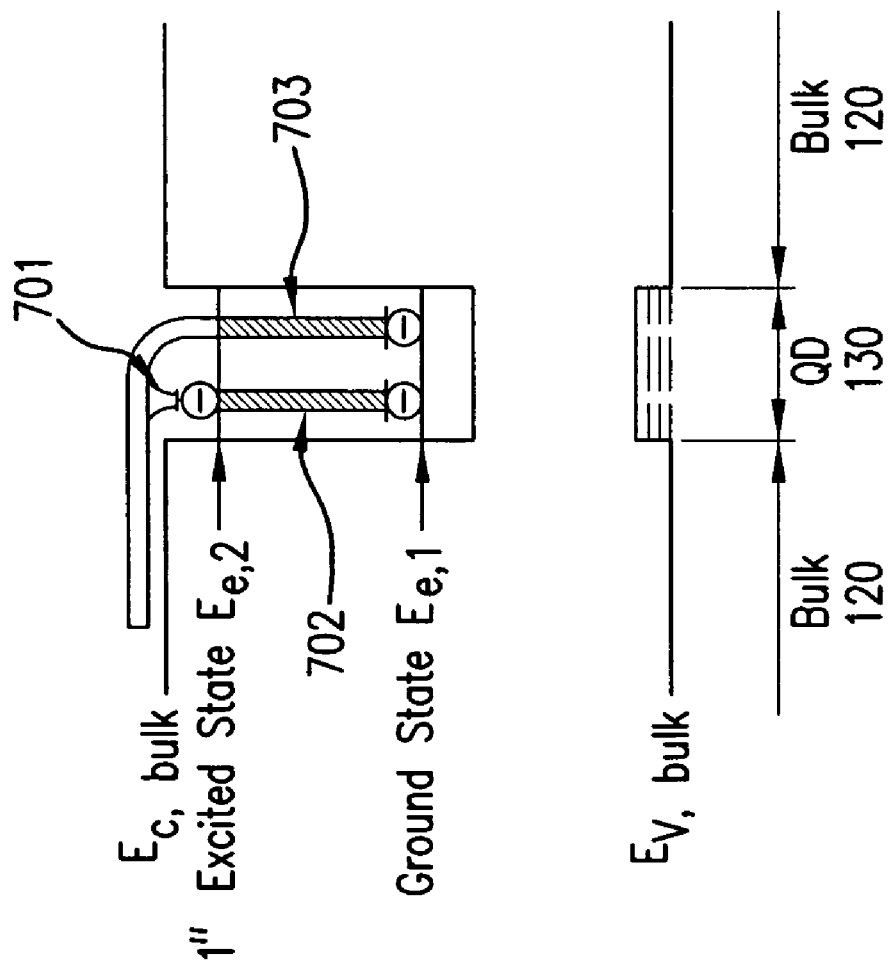
FIG. 6 shows an energy band diagram for a cross-section of an inorganic quantum dot in an inorganic matrix material, illustrating de-excitation and trapping of a passing electron.

FIG. 6 illustrates a free electron being trapped by the quantum dot 130 when the charge carrier decays to an excited state $E_{e,2}$ (701) or to the ground state $E_{e,1}$ (702, 703). This de-excitation process reduces photocurrent as the energy is absorbed into the lattice as phonons. Similar carrier de-excitation and trapping also happens with holes. Accordingly, to improve the performance of intermediate-band solar cells, there is a need to reduce charge carrier de-excitation due to charge trapping. U.S. application Ser. No. 11/598,006 to Forrest et al., which is incorporated herein in its entirety, reduces de-excitation trapping by encapsulating each quantum dot in a thin barrier shell to require carriers to perform quantum mechanical tunneling to enter the dot if the dots are formed by the Stranski-Krastanow technique discussed above, carriers will tunnel through the barrier layers to transit between bulk layers. These devices including such a series of tunneling barriers are referred to as a "dots-in-a-fence" (DFENCE) heterostructure.

The solar cells of the present invention prevent electron trapping into the dots and reduce space charge accumulation without incorporating extra fence layers or barrier shells around the dots due to the type II band alignment employed in the photovoltaic devices. In contrast to traditional type I quantum dots, where the conduction band of the matrix materials is at a higher energy level than that of the quantum dot and the valence band of the matrix material is at a lower energy level, in quantum dots with type II band alignment, the conduction and valence bands of the quantum dots are both at a higher energy level than the matrix materials. The staggered band alignment of direct bandgap materials are believed to form the unique property characteristics of these heterostructures. It is further believed that spatial separation of two-dimensional electrons and holes at the interface of the quantum dots and the matrix material results in a tunability of their optical properties. Consequently, the staggered band alignment may allow optical emission at energies less than the bandgap of each of the matrix semiconductors forming a heterojunction.

In one embodiment, the photovoltaic comprises a plurality of fence layers consisting essentially of a semiconductor material disposed in a stack between a p-type and n-type semiconductor material and a plurality of layers consisting essentially of alternating layers of quantum dots of a second semiconductor material embedded between and in direct contact with a third semiconductor material. The alternating layers are disposed in the stack between and in direct contact with a respective two of the layers of the first semiconductor material. Each quantum dot provides at least one quantum state at an energy between a conduction band edge and a valence band edge of the adjacent layers of the first semiconductor material. Each quantum dot of the second semiconductor material and the third semiconductor material form a heterojunction having a type II band alignment. The third semiconductor material may be an inorganic semiconductor matrix.

Preferably, the first semiconductor material is Al$_x$Ga$_{1-x}$As, wherein x>0. This is believed to minimize the saturation leakage of carriers. In preferred embodiments, the second semiconductor material is GaSb and the third semiconductor material is GaAs. FIG. 2a shows a preferred embodiment having such a structure wherein the p-type and n-type semiconductors are both GaAs.

GaSb/GaAs type II quantum dots with the staggered band alignment have been characterized and reported in literature. Holes are localized within the GaSb dots due to large valence band offset (~0.81 eV), and electrons produce a shallow quantum shell around the dots due to the Coulomb interaction with the localized hole thereby forming a spatially indirect exciton state. See Hatami et al., Appl. Phys. Lett. 67, 656 (1995). The electron and hole wavefunctions have about a 60% overlap compared to an 80% overlap found in InAs/GaAs, a type I intermediate band quantum dots structure. See M. Grundman et al., Phys. Rev. B 52, 11969 (1995); F. Hatami et al., Phys. Rev. B 57, 4635 (1998). The overlap in wavefunctions for a type II quantum dot heterostructure is believed to depend on the potential height of the barrier separating the electrons from the holes in addition to the size of the dots themselves. The smaller overlap of the electron and hole wavefunctions results in type II quantum dot heterostructures having longer radiative lifetimes (~23 ns) compared to type I quantum dot structures, such as InAs/GaAs (~1 ns). See H. Born et al., Phys. Status Solidi B 228, R4 (2001); W. H. Chang et al., Phys. Rev. B 62, 6259 (2000). Reducing the recombination rate in dots is also an important consideration in designing the quantum dots to function as generation centers instead of recombination centers with quasi-Fermi level splitting between matrix and dots. This is desirable for obtaining a power conversion efficiency greater than that currently reported for single homojunction photovoltaic cells.

When type II GaSb quantum dots are located between a conventional p-n junction, it is believed that the absorption of sub-ban gap photon will directly pump the electrons from the discrete hole energy level in the GaSb to the GaAs matrix.

Further, the strain located near the GaSb/GaAs interface causes the lower limit of the conduction band offset to be between 0.05-0.1 eV. See Kapetyn et al., Phys. Rev. B, 60, 14265 (1999). As discussed above, the higher conduction band energy level in GaSb quantum dots prevent electron trapping in the dots. The high potential well, however, may trap hole carriers thereby increasing the charge accumulation and recombination with electrons in the GaAs matrix. Consequently, the dark current from the quantum dot layers may increase in an open circuit voltage of quantum dot cells. Accordingly, two $Al_xGa_{1-x}As$ fence layers may be added at the edges of the depletion regions, as shown in the preferred embodiment of FIG. 2(a). It is believed that the $Al_xGa_{1-x}As$ fence layers reduces the dark current from minority carrier generation and extraction and from thermionic hole current from the GaSb dots, without compromising the sub-bandgap photon absorption.

The formation and optical characteristics of type II strain-relieved, and densely stacked GaSb/GaAs quantum dots using interfacial misfit (IMF) growth mode have demonstrated excellent crystalline quality and room temperature electroluminescence. See Tatebayashi, et al., Appl. Phys. Lett. 89, 203116 (2006). The overall compressive strain from GaSb quantum dots due to about 7% lattice mismatch may be relaxed by relieving the strain at the interface of the GaSb quantum dots and the GaAs matrix. The electron and hole energy levels of the GaSb quantum dots may be calculated from the relatively small spike (~0.1 eV) in the conduction band resulting from the fully relaxed type II GaSb/GaAs quantum dots and large valence band offset (0.81 eV) and with the matrix elements determined through the effective mass envelope function theory for the quantum dots. See e.g. Wei and Forrest, Nano. Lett. 7, 218 (2007). The spatial distribution of GaSb quantum dots in GaAs matrix may be treated as a dense, periodically arranged array of cylinder with height h and radius R. The thickness of the surrounding GaAs layer is d and the period for the quantum dot "unit cell" is L, which is parallel to the plane of the substrate surface. It is believed that the height and radius of the quantum dots may be varied to fully absorb the sub bandgap photons.

The simple layered structure illustrated in FIGS. 1 and 2(a) is provided by way of non-limiting example, and it is understood that embodiments of the invention may be used in connection with a wide variety of other structures. The specific materials and structures described are exemplary in nature, and other materials and structures may be used.

It is understood that the various embodiments described herein are by way of example only, and are not intended to limit the scope of the invention. For example, many of the materials and structures described herein may be substituted with other materials and structures without deviating from the spirit of the invention. It is understood that various theories as to why the invention works are not intended to be limiting. For example, theories relating to charge carriers are not intended to be limiting.

Experimental

Figure 3:
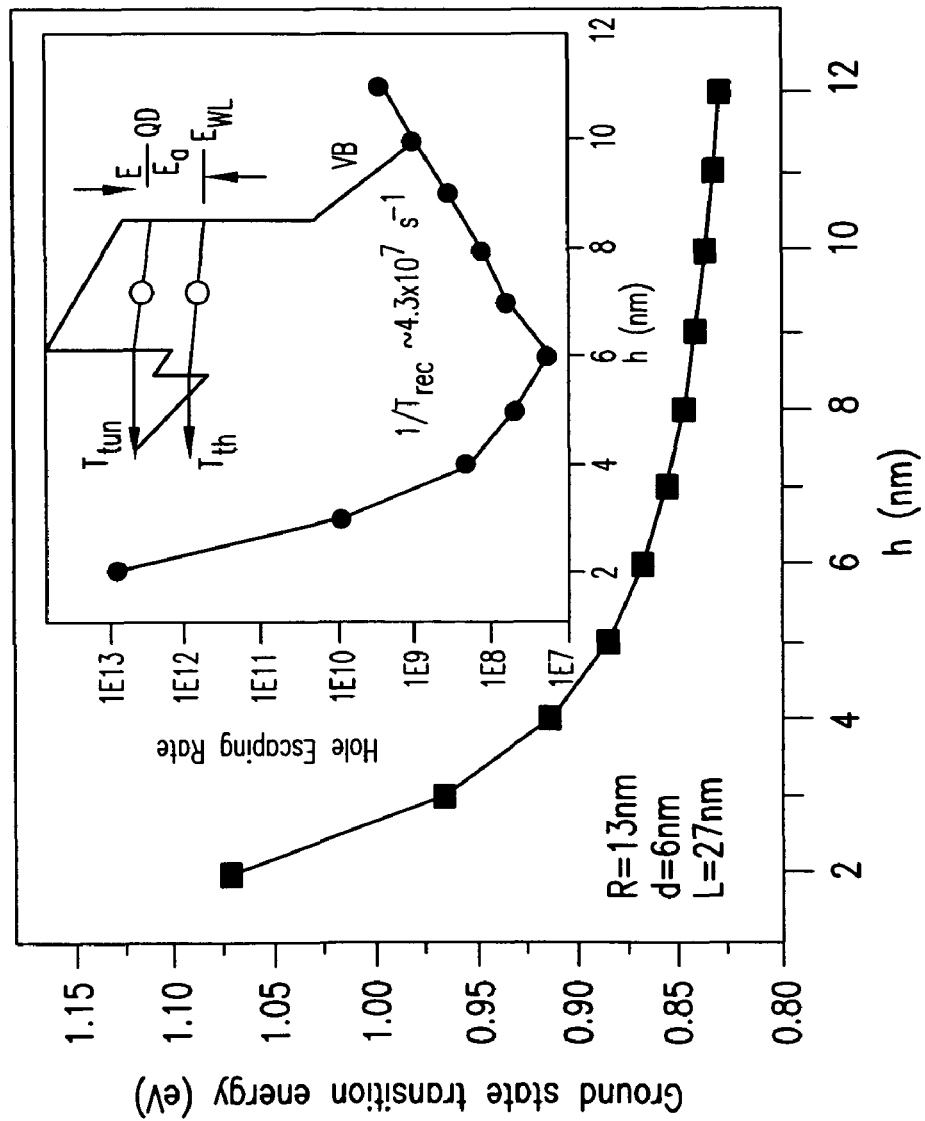
FIG. 3 shows a plot of the ground state transition energy vs. quantum dot height for a quantum dot solar cell having the structure depicted in FIG. 2. The radius of dots is 13 nm. h corresponds to the dot length; d corresponds to the thickness of the surrounding GaSb layer; and L corresponds to the distance between quantum dots in the plane of the substrate surface. The inset graph shows a schematic diagram of direct hole tunneling and thermally assisted hole tunneling process.

FIG. 3 shows the ground state transition energy vs. quantum dot height for a GaSb/GaAs quantum dot heterostructure with a staggered type II band alignment. For a quantum dot radius 13 nm, the ground state photon transition energies decrease from 1.07 eV to 0.82 eV. For a dot height of 2 nm, the ground state transition energy is about 1.07 eV, which approaches the first peak of the photoluminescence spectrum at 1.05 eV for similar quantum dot sizes. See Geller et al., Appl. Phys. Lett. 82, 2706 (2003).

The device performance of low-dimension (quantum dot or quantum well) solar cells are believed to depend on the carrier escape sequence. For most III-IV type I nanostructure systems, light holes are found to escape first. To prevent severe open circuit voltage degradation, it is desirable that electrons escape prior to heavy holes. If heavy holes escape before electrons, negative charge may accumulate in the quantum dots (or wells) strengthening the built-in electric field. Such a large negative carrier accumulation in the quantum dot material will locally weaken the built-in electric field in the depletion region and the corresponding carrier escape probability. This is believed to increase the recombination rates resulting in a drop of the open circuit voltage. Because quantum dot solar cells with type II band alignment are characterized by weak electron localization (due to Coulomb interaction with local holes) photogenerated electrons will excite directly to the interface of the GaAs matrix and the GaSb quantum dot. The built-in electric field will drift electrons across the depletion region. See also Tatebayashi et al., Appl. Phys. Lett. 89, 203116 (2006). Thus, the electrons are believed to escape from the quantum dots to the matrix prior to heavy holes in type II heterostructures.

The holes are strongly confined to the quantum dots and the localization energy is about 450 meV. See Geller et al., Appl Phys. Lett. 82, 2706 (2003). In the many particle region, the hole-hole interaction of the strongly localized holes (Coulomb charging) dominates the electron-electron and electron-hole interactions. As a result, the activation energy for holes from discrete energy level in GaSb quantum dots to the GaAs matrix decreases from about 450 meV to about 140-150 meV. (see Kirsch, et al., Appl. Phys. Lett. 78, 1418 (2001)), which corresponds to an increase in the average hole occupation of the quantum dots and repulsion force among accumulated holes.

With an increasing amount of charge in the quantum dots, state filling and Coulomb interaction lower the thermal activation energy ($E_a$). The reduced $E_a$, shown in the inset of FIG. 2, accelerates the rate of escape of holes. In the presence of a built-in electric field F, the quantum dot potential height will be reduced by qFh/2, where q represents the electric charge. See C. M. A Kapteyn et al., Phys. Rev. B, 60, 14265 (1999). Because the electron localization in type II quantum dots is negligible, the localization energy between hole energy level $E_l$ and the intermediate level in the GaSb wetting layers may be calculated from the difference in transition energy between the GaSb quantum dots ($E_{QD}$) and the wetting layers ($E_{wl}$~1.39 eV).

The Coulomb charging energy $E_N$ required to charge N holes into a disliked dot may be expressed as $$E_N = \frac{\left(N - \frac{1}{2}\right)q^2}{4\varepsilon_{GaAs}\varepsilon_0 D},$$

where D is the typical diameter of dots, $\epsilon_0$ is the vacuum dielectric constant, and $\epsilon_{GaAs}$=13.1.

The thermal activation energy of hole carriers in the energy level of E1 may be expressed as $$E_a = E_{wl} - E_{QD} - E_N - \frac{qFh}{2}$$

The hole escape process may be characterized as thermal activation into excited level located in the GaSb wetting lay ers with subsequent tunnel emission. Accordingly, the hole emission rate may be expressed as $$e_a = \sigma_l v N_v \exp\left(\frac{-E_a}{kT}\right),$$

where $N_v$ is the effective density of hole states in GaSb, $\sigma_l$ is the capture cross section of holes on the level E1 ($\sigma_l=(6\pm3)\times 10^{-16}$ cm$^{-2}$), $v$ is the average thermal velocity of holes in GaAs buffer (~1.3×10$^5$ m/s).

Figure 2:
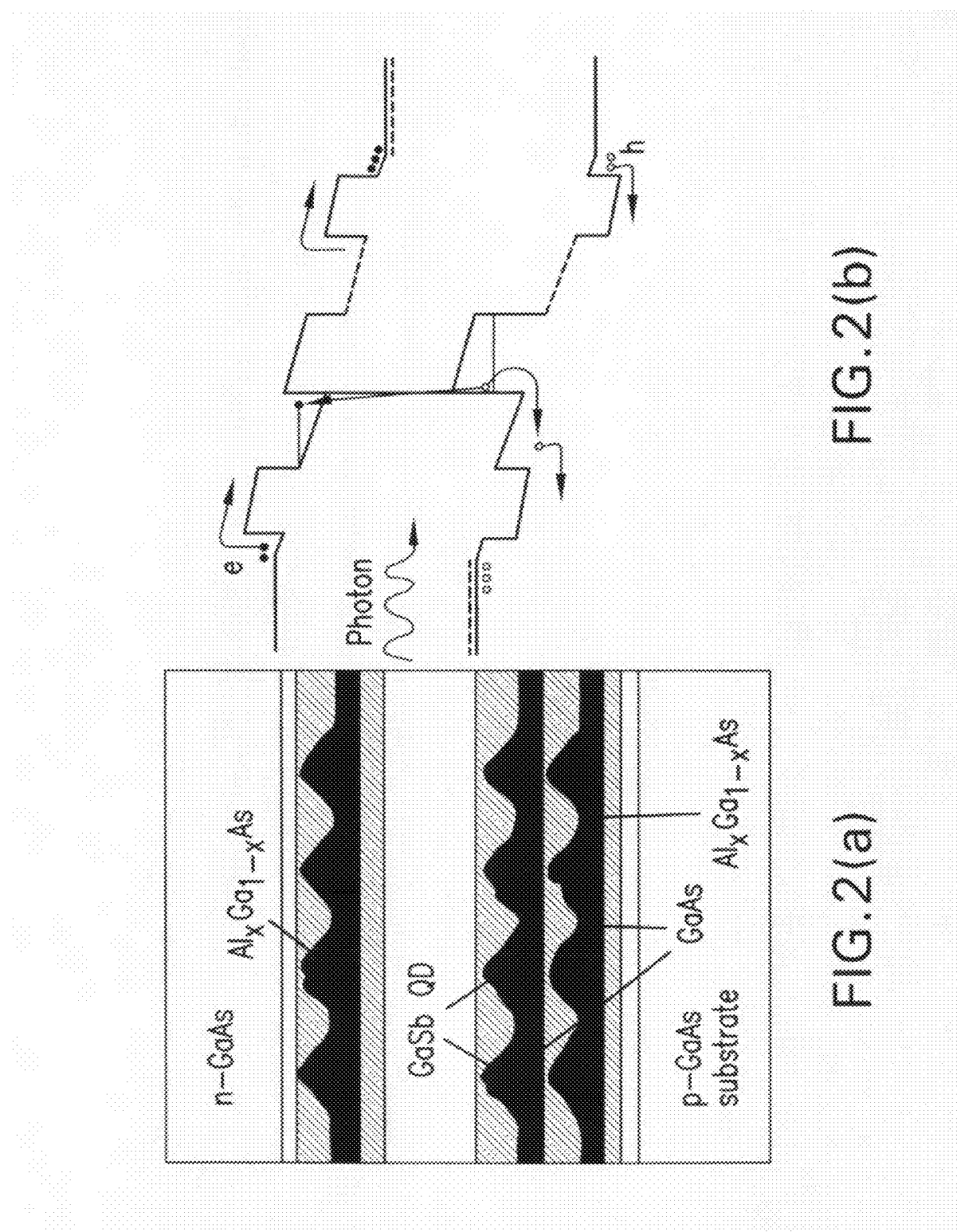
FIG. 2(a) shows the structure of a GaSb quantum dot solar cell with two $Al_xGa_{1-x}As$ layers and 2(b) shows the corresponding energy-level diagram.

The calculated hole escaping rate of a thermally assisted tunneling process shown in FIG. 2 decreases from 8×10$^{12}$ s$^{-1}$ (h=2 nm) to 2×10$^7$ s$^{-1}$ (h=6 nm), then increases to 3×10$^9$ s$^{-1}$ (h=11 nm). This is believed to be a tradeoff between localization energy and the potential barrier reduction with the quantum dot height.

It is believed that having an optimal quantum dot radius and height and the built in electric field in the depletion region increases the hole rate of escape such that it will be larger than the radiative recombination rate (~4.3×10$^7$ s$^{-1}$). Consequently, the photogenerated hole carriers may contribute to the sub bandgap photocurrent without experiencing majority recombination in the dots. Thus, it is believed that an important design consideration in the built-in electric field is its ability to facilitate hole tunneling through the potential well in the valence band potential.

The contribution to the baseline-cell reverse saturation current from minority carrier generation and extraction near the neutral region edges, $J_0$, will also increase due to the extra radiative recombination current in the GaSb quantum dots. The reverse saturation current $J_{01}$ may be expressed as $$J_{01} = J_0\left[1 + hl\sqrt{\frac{qNB}{4kT\mu}}\exp\left(\frac{\Delta E_v - E_l}{kT}\right)\right],$$

where $l$ is the number of quantum dot layers, B is the radiative recombination coefficient, N is an effective doping concentration related to the n- and p- side dopings and $\mu$ is an effective mobility related to the electron and hole motilities. See Anderson and Wojtczuk, J. Appl. Phys. 79, 1973 (1996).

The current density from the thermal emission of holes may be expressed as $$J_{02} = \sum_{i=0}^{L} N_{dot} q \sigma_1 v N_v l \exp\left(-\frac{\Delta E_v - E_l}{kT}\right)$$

where $N_{dot}$ is the area density of quantum dots, and L is the number of the discrete energy level in the dots.

Figure 4:
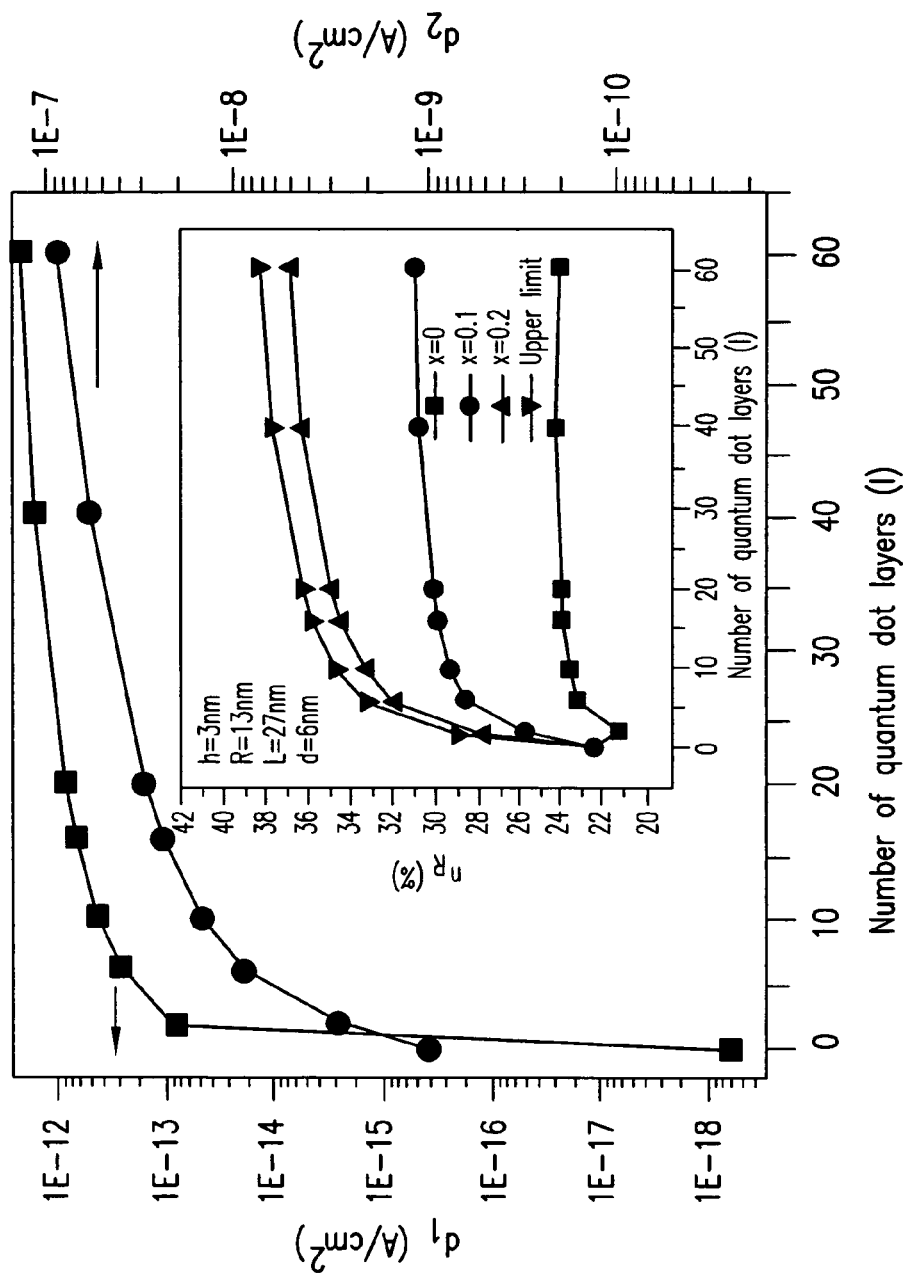
FIG. 4 shows the minority carrier diffusion, $J_{01}$, and the dark current from GaSb quantum dots $J_{02}$ of solar cells with stacked GaSb quantum dots. The inset graph shows the calculated power conversion efficiency vs. number of quantum dot layers with a radius of 13 nm when x increases from 0, 0.1 to 0.2.

The calculated diode reverse saturation current $J_{01}$ and $J_{02}$ increases gradually with the number of quantum dot layers shown in FIG. 4 (h=3 nm, R=13 nm).

The dark current will be greatly reduced with an increase in bandgap offset energy $\Delta E$, between GaAs and Al$_x$Ga$_{1-x}$As layers and may be expressed as $$J = J_{01}\exp\left(-\frac{\Delta E}{kT}\right)\left[\exp\left(\frac{qV}{kT}\right) - 1\right] + \left[J_{02}\exp\left(-\frac{\Delta E}{kT}\right) + J_{NR}\right]\left[\exp\left(\frac{qV}{2kT}\right) - 1\right] - J_{SC},$$

which incorporates the generation and recombination currents ($J_{NR}$).

The overall power conversion efficiency with and without two Al$_x$Ga$_{1-x}$As fence layers are shown in FIG. 4. With no fence layers, (x=0), power conversion efficiency decreases from 22.5% (no dots) to 21.3% for a device having two layers of quantum dots. Increasing the number of quantum dot layers also increases the absorption efficiency of GaSb quantum dots. This contributes to the increase of sub bandgap photocurrent, which overcompensates for the slight decrease of open circuit voltage. Thus, the overall efficiency approaches the saturation limit of 24.5% with about 10 to about 20 layers of stacked GaSb/GaAs quantum dots in the intrinsic region.

The efficient separation of electron-hole pairs generated in the GaSb quantum dots by the built-in electric field, notwithstanding the recombination in the depletion region, increases the sub bandgap photocurrent. Increasing the Al$_x$Ga$_{1-x}$As potential barrier (x=0.1, 0.2), as shown in the inset in FIG. 4, reduces the dark current $J_{01}$ and $J_{02}$ by a factor of $$\exp\left(-\frac{\Delta E}{kT}\right).$$

Thus, when x=0.2, the cells with 16 layers of quantum dots approach 34.7% power conversion efficiency with 0.881 V open circuit voltage. This is comparable to the 0.903 V from the cells without any quantum dots or fence layers. FIG. 4 also shows that the upper limit of power conversion efficiency in a type II heterostructure may be about 38.5% when x=0.2.

While the present invention is described with respect to particular examples and preferred embodiments, it is understood that the present invention is not limited to these examples and embodiments. The present invention as claimed therefore includes variations from the particular examples and preferred embodiments described herein, as will be apparent to one of skill in the art.

What is claimed is:
1. A photovoltaic device, comprising:
a first electrode and a second electrode;
a layer of a p-type semiconductor material disposed in a stack between the first electrode and the second electrode;
a layer of an n-type semiconductor material disposed in a stack between the first electrode and the second electrode;
a plurality of fence layers consisting essentially of a first semiconductor material disposed in a stack between the p-type and n-type semiconductor material layers;
a plurality of layers consisting essentially of alternating layers of quantum dots of a second semiconductor material embedded between and in direct contact with a third semiconductor material that is different from the first semiconductor material, wherein the alternating layers are disposed in the stack between and in direct contact with a respective two of the plurality of fence layers, and wherein each quantum dot provides at least one quantum state at an energy between a conduction band edge and a valence band edge of the adjacent layers of the first semiconductor material; and
wherein each quantum dot of the second semiconductor material and the third semiconductor material form a heterojunction having a type II band alignment.
2. The device of claim 1, wherein
the p-type semiconductor material is GaAs;
the first semiconductor material is Al$_x$Ga$_{1-x}$As, wherein x>0;
the second semiconductor material is GaSb; and
the third semiconductor material is GaAs.

3. The device of claim 2, comprising from about 10 to about 20 alternating layers of the second semiconductor material and the third semiconductor material.

4. The device of claim 3, wherein the n-type semiconductor material is GaAs.

5. A method of fabricating a photovoltaic device, comprising:
- depositing a layer of a p-type semiconductor material over a first electrode;
- depositing a plurality of fence layers consisting essentially of a first semiconductor material over the layer of the p-type semiconductor material;
- depositing a plurality of layers consisting essentially of alternating layers of quantum dots of a second semiconductor material embedded between and in direct contact with a third semiconductor material that is different from the first semiconductor material, wherein the alternating layers are disposed in the stack between and in direct contact with a respective two of the plurality of fence layers; and each quantum dot provides at least one quantum state at an energy between a conduction band edge and a valence band edge of the adjacent layers of the first semiconductor material; and each quantum dot of the second semiconductor material and the third semiconductor material form a heterojunction having a type II band alignment;
- depositing a layer of an n-type semiconductor material over an end layer of the plurality of the fence layers; and
- depositing a second electrode over the n-type semiconductor layer to form the photovoltaic device.

6. The method of claim 5, wherein
the p-type semiconductor material is GaAs;
the first semiconductor material is $Al_xGa_{1-x}As$, wherein $x>0$;
the second semiconductor material is GaSb; and
the third semiconductor material is GaAs.

7. The method of claim 6, comprising from about 10 to about 20 alternating layers of the second semiconductor material and the third semiconductor material.

8. The method of claim 7, wherein the n-type semiconductor material is GaAs.

* * * * *